(12) United States Patent
Chaudhry et al.

(10) Patent No.: US 8,447,931 B1
(45) Date of Patent: May 21, 2013

(54) PROCESSOR WITH A REGISTER FILE THAT SUPPORTS MULTIPLE-ISSUE EXECUTION

(75) Inventors: Shailender Chaudhry, San Francisco, CA (US); Paul Caprioli, Mountain View, CA (US); Marc Tremblay, Menlo Park, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1687 days.

(21) Appl. No.: 11/173,110

(22) Filed: Jul. 1, 2005

Related U.S. Application Data

(60) Provisional application No. 60/605,194, filed on Aug. 27, 2004.

(51) Int. Cl.
*G06F 12/00* (2006.01)

(52) U.S. Cl.
USPC ..... 711/131; 711/150; 711/168; 711/E12.044

(58) Field of Classification Search
None
See application file for complete search history.

(56) References Cited

U.S. PATENT DOCUMENTS

| 5,481,495 | A | * | 1/1996 | Henkels et al. | 365/189.02 |
| 5,813,037 | A | | 9/1998 | Martell et al. | |
| 5,929,660 | A | | 7/1999 | Dillinger | |
| 7,093,107 | B2 | * | 8/2006 | Jarvis | 712/218 |
| 2004/0060015 | A1 | | 3/2004 | Mochizuki | |

* cited by examiner

*Primary Examiner* — Reginald Bragdon
*Assistant Examiner* — Eric Loonan
(74) *Attorney, Agent, or Firm* — Park, Vaughan, Fleming & Dowler, LLP

(57) ABSTRACT

One embodiment of the present invention provides a processor that supports multiple-issue execution. This processor includes a register file, which contains an array of memory cells, wherein the memory cells contain bits for architectural registers of the processor. The register file also includes multiple read ports and multiple write ports to support multiple-issue execution. During operation, if multiple read ports simultaneously read from a given register, the register file is configured to: read each bit of the given register out of the array of memory cells through a single bitline associated with the bit; and to use a driver located outside of the array of memory cells to drive the bit to the multiple read ports. In this way, each memory cell only has to drive a single bitline (instead of multiple bitlines) during a multiple-port read operation, thereby allowing memory cells to use smaller and more power-efficient drivers for read operations.

21 Claims, 5 Drawing Sheets

US 8,447,931 B1

PROCESSOR WITH A REGISTER FILE THAT SUPPORTS MULTIPLE-ISSUE EXECUTION

RELATED APPLICATION

This application hereby claims priority under 35 U.S.C. section 119 to U.S. Provisional Patent Application No. 60/605,194, filed on 27 Aug. 2004, entitled "Processor with a Register File that supports Multiple Issue Execution," by inventors Shailender Chaudhry, Paul Caprioli and Marc Tremblay.

BACKGROUND

1. Field of the Invention

The present invention relates to techniques for improving computer system performance. More specifically, the present invention relates to a space-efficient and power-efficient register file for a multiple-issue processor.

2. Related Art

As semiconductor integration densities continue to increase, it is becoming common practice to incorporate multiple functional units into a single microprocessor core. For example, some processors presently include multiple arithmetic logic units (ALUs), as well as a branch pipeline and a memory pipeline. These multiple functional allow the processor to execute instructions in parallel, which can greatly increase processor performance. These processors, which support simultaneous execution of multiple instructions, are generally referred to as "multiple-issue processors" because they allow multiple instructions to be issued at the same time.

In order to support simultaneous execution of multiple instructions, multiple-issue processors require register files with multiple read ports and multiple write ports. For example, a multiple-issue processor with 2 ALUs, a branch pipe and a memory pipe might require 7 read ports (2 for each of the 2 ALUs and three for the memory pipe) and 3 write ports (1 for each of the 2 ALUs and one for the memory pipe).

In the worst case, during a read operation all of the read ports will simultaneously access a single register. In existing register files, this worst-case read operation requires a driver within each memory cell of the target register to simultaneously drive bitlines for all of the read ports. (Note that it is possible to restrict the number of reads that can be directed to a single register, but this restricts processor performance and can greatly complicate processor/compiler design because the processor/compiler must ensure that only a limited number of read ports can simultaneously read from the register file.)

In order to simultaneously drive multiple bitlines, larger drivers must be incorporated into memory cells. However, these larger drivers consume more power and also require more chip area. This increases the size of each memory cell, which increases the overall size of memory cell array. A larger memory array increases the size of the bitlines that must be driven by the memory cells, which further increases the size of the drivers within the memory cells. This can result in a very large register file, which consumes a large amount of power and requires a long access time.

Hence, what is needed is a register file design that allows multiple reads ports to simultaneously read data from a single register without requiring large drivers in all of the memory cells.

SUMMARY

One embodiment of the present invention provides a processor that supports multiple-issue execution. This processor includes a register file, which contains an array of memory cells, wherein the memory cells contain bits for architectural registers of the processor. The register file also includes multiple read ports and multiple write ports to support multiple-issue execution. During operation, if multiple read ports simultaneously read from a given register, the register file is configured to: read each bit of the given register out of the array of memory cells through a single bitline associated with the bit; and to use a driver located outside of the array of memory cells to drive the bit to the multiple read ports. In this way, each memory cell only has to drive a single bitline (instead of multiple bitlines) during a multiple-port read operation, thereby allowing memory cells to use smaller and more power-efficient drivers for read operations.

In a variation on this embodiment, wordlines associated with specific read ports of the register file are encoded to reduce the number of wordlines, wherein using fewer wordlines reduces the length of the bitlines that span the wordlines, and wherein using shorter bitlines reduces the size of the drivers required to drive the bitlines.

In a further variation, if the register file provides N read ports, the N read wordlines for a given register are encoded using: a single read wordline to carry a read wordline signal to memory cells of the given register; and $\log_2 N$ selection signals, wherein for each bit in the given register, the $\log_2 N$ selection signals are used select a single bitline (from N possible bitlines) to carry the bit out of the array of memory cells. Note that if the bit is directed to multiple read ports, circuitry outside of the array of memory cells is used to direct the bit to the multiple read ports.

In a further variation, the execution pipeline of the processor is configured to speculatively read architectural registers for an instruction while the instruction is being decoded, thereby eliminating the need for an out-of-order processor to provide an additional pipeline stage to read the architectural registers.

In a further variation, a bypass network associated with the execution pipeline is configured to forward an updated version of an operand from an architectural register if the operand is updated after the operand is speculatively read for an instruction (but before the instruction is executed).

In a variation on this embodiment, after the bits of the given register are read out from the single bitlines, the bits are stored in latches located outside of the array of memory cells before being driven to (possibly multiple) read ports.

In a variation on this embodiment, bitline drivers within the memory cells are only large enough to drive a single bitline, and are not large enough to drive multiple bitlines.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Processor

Figure 1:
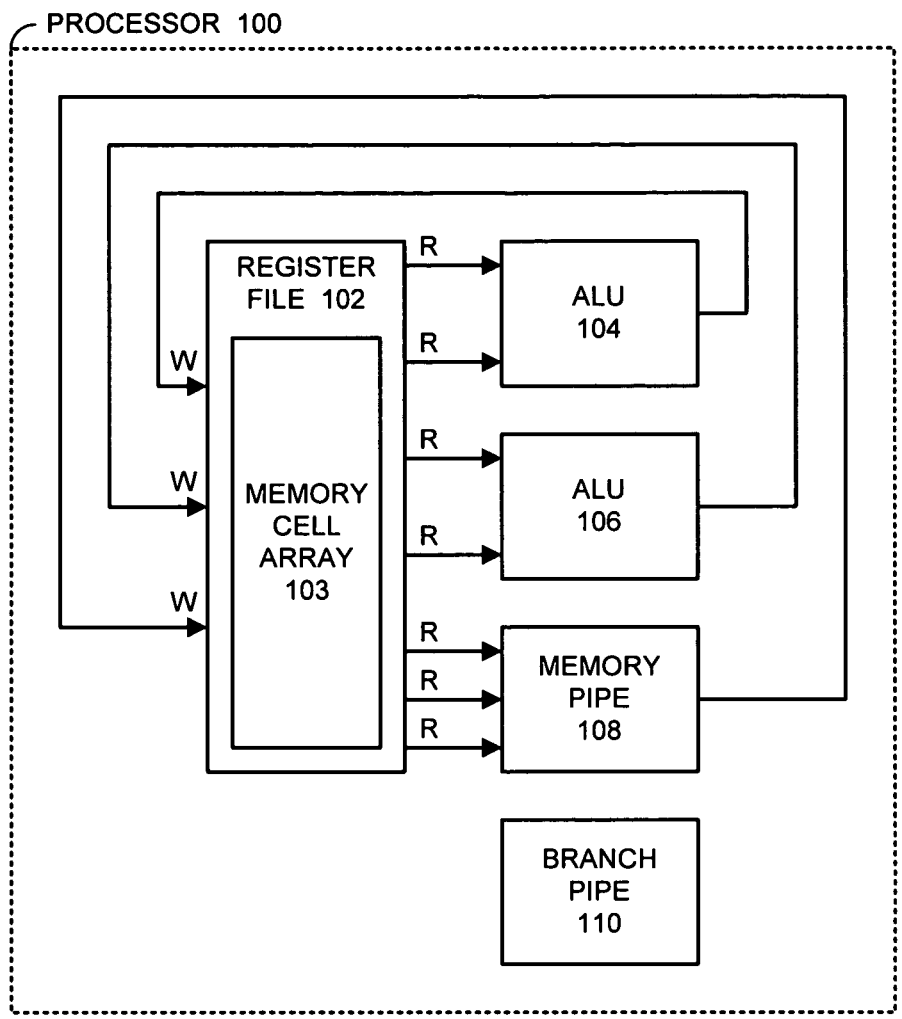
FIG. 1 illustrates a processor in accordance with an embodiment of the present invention.

FIG. 1 illustrates internal structures within a processor 100 in accordance with an embodiment of the present invention. Processor 100 can generally include any type of processor, including, but not limited to, a microprocessor, a mainframe computer, a digital signal processor, a personal organizer, a device controller and a computational engine within an appliance.

As is illustrated in FIG. 1, processor 100 contains register file 102, arithmetical logic units (ALUs) 104 and 106, memory pipe 108 and branch pipe 110. Register file 102 contains architectural registers for processor 100. ALUs 104 and 106 perform computational operations involving operands from register file 102. Memory pipe 108 performs address computations and corresponding accesses to cache memory. Finally, branch pipe 110 resolves control transfer computations for processor 100.

Register file 102 includes three write ports (labeled with a "W") and seven read ports (labeled with an "R"). There read and write ports are used by various functional units. In particular, ALUs 104 and 106 each use two read ports and a single write port; memory pipe 108 uses three read ports and a single write port; and branch pipe 110 does not require any register ports. Register file 102 also includes a memory cell array 103, wherein the memory cells contains bits for registers within register file 102.

In the worst case, all seven read ports simultaneously access a single target register within register file 102. This requires the value from the target register to be fanned out to all seven read ports. The present invention does this without having to use large drivers within each memory cell in register file 102. This is accomplished using a design which is described below with reference to FIGS. 2-6.

Memory Cell

Figure 2:
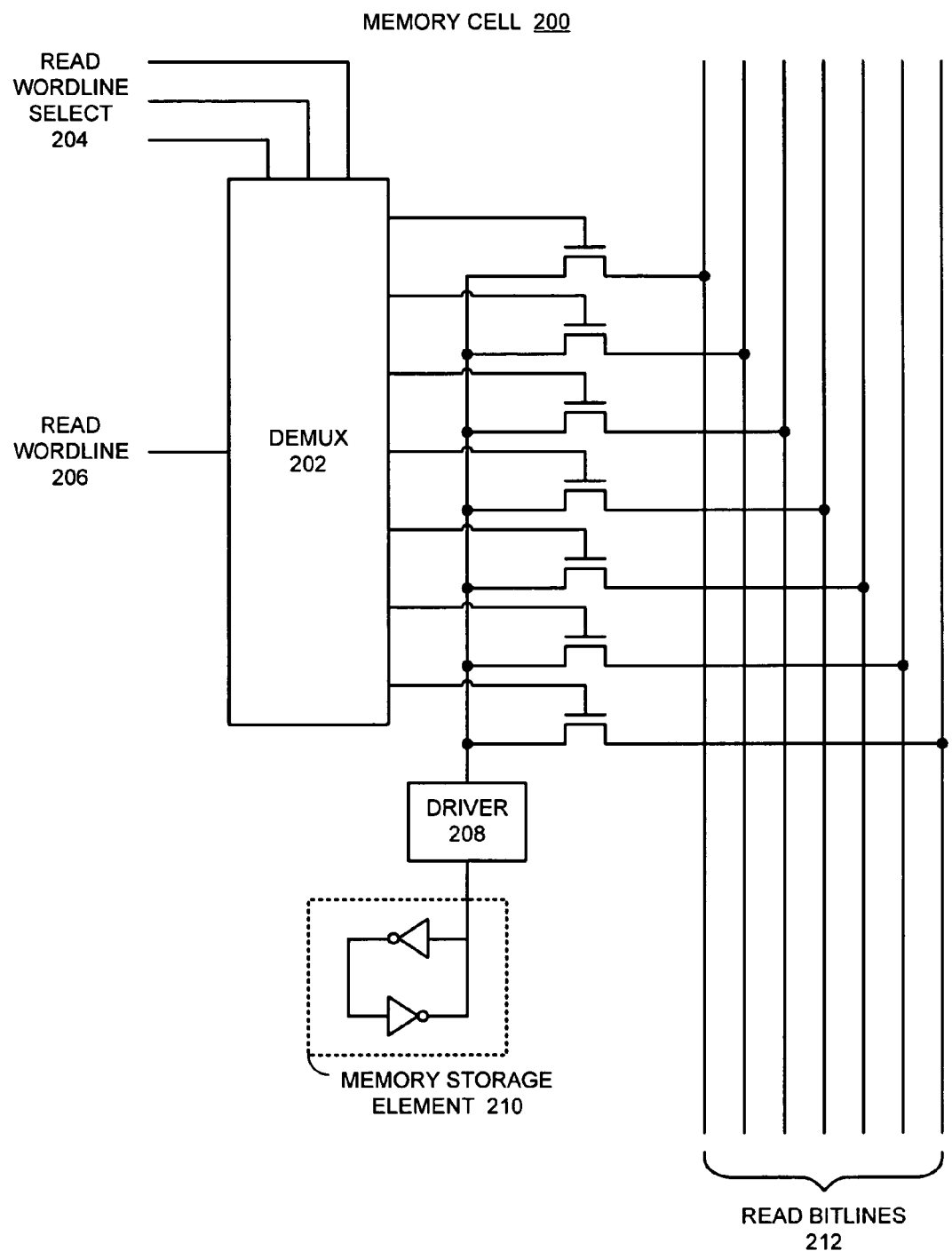
FIG. 2 illustrates a memory cell in accordance with an embodiment of the present invention.

FIG. 2 illustrates a memory cell 200 within memory cell array 103 in accordance with an embodiment of the present invention. Memory cell 200 includes a standard bistable circuit, which functions as a memory storage element 210. It also includes a driver 208, which drives only one of seven bitlines 212 during a read operation. Note that because driver 208 only has to be large enough to drive a single bitline, it can be significantly smaller than a driver that can drive all seven read bitlines 212 at the same time.

Instead of receiving seven read wordlines for the seven bitlines, memory cell 200 receives a single read wordline 206 and three wordline select signals 204. These three wordline select signals 204 feed into a demultiplexer (DEMUX) 202, which directs the signal from read wordline 206 to a selected one of the seven outputs from DEMUX 202. These seven outputs from DEMUX 202 feed into gate inputs pass transistors, which direct the output of driver 208 to the seven read bitlines 212. Because at most a single output of DEMUX 202 is asserted at a given time, driver 208 will only have to drive a single read bitline at any given time. This single read bitline can be fanned out to possibly multiple read ports after the signal is read out of memory cell array 103 through the single bit line.

Note that for purposes of clarity, other circuitry within memory cell 200, such as the circuitry involved in write operations, is not illustrated in FIG. 2.

Wordlines and Bitlines

Figure 3:
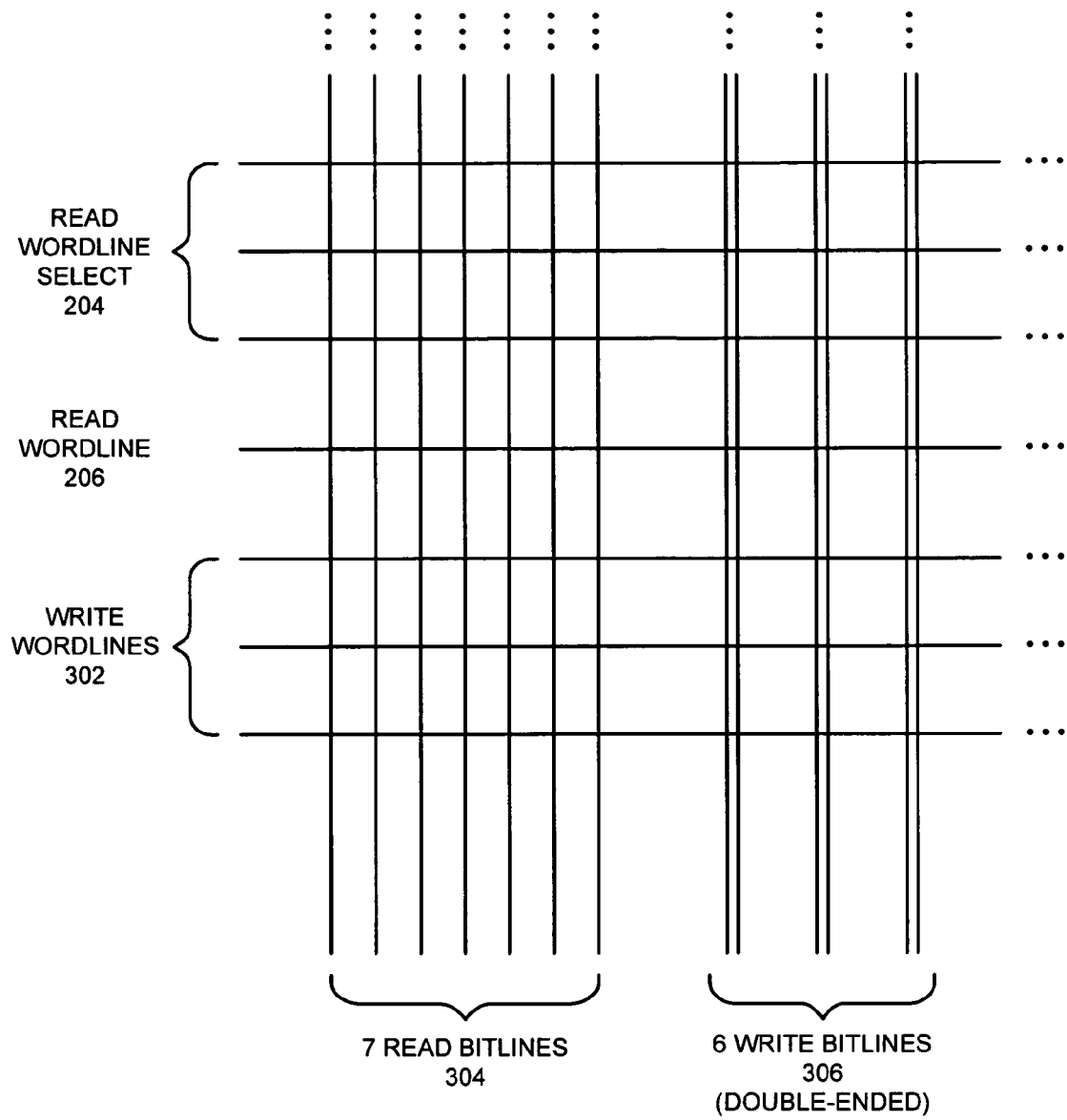
FIG. 3 illustrates wordlines and bitlines associated with a memory cell in accordance with an embodiment of the present invention.

FIG. 3 illustrates wordlines and bitlines associated with a given memory cell in accordance with an embodiment of the present invention. Recall that register file 102 illustrated in FIG. 1 includes memory cell array 103. Each row of memory cell array 103 contains memory cells which store bits for a specific register within register file 102. Each of these rows is associated with three read wordline select signals 204 and a single read wordline 206, as well as three write wordlines 302.

Each column of memory cell array 103 is associated with seven read bitlines and six write bitlines. There are seven read bitlines because if seven reads take place simultaneously and they are all directed to different registers, seven values have to be read out of register file 102 simultaneously. The six write bitlines carry double-ended signals, so the six write bitlines actually carry only three write values. This allows three write operations to take place simultaneously.

Note that by using four signals (a single read wordline signal and three select signals) instead of seven read wordline signals, the (vertical) bitlines have to cross fewer (horizontal) wordlines. Hence, the bitlines can be shorter, which means that driver 208 can be smaller, and that there is less propagation delay through the bitlines.

Routing Circuitry

Figure 4:
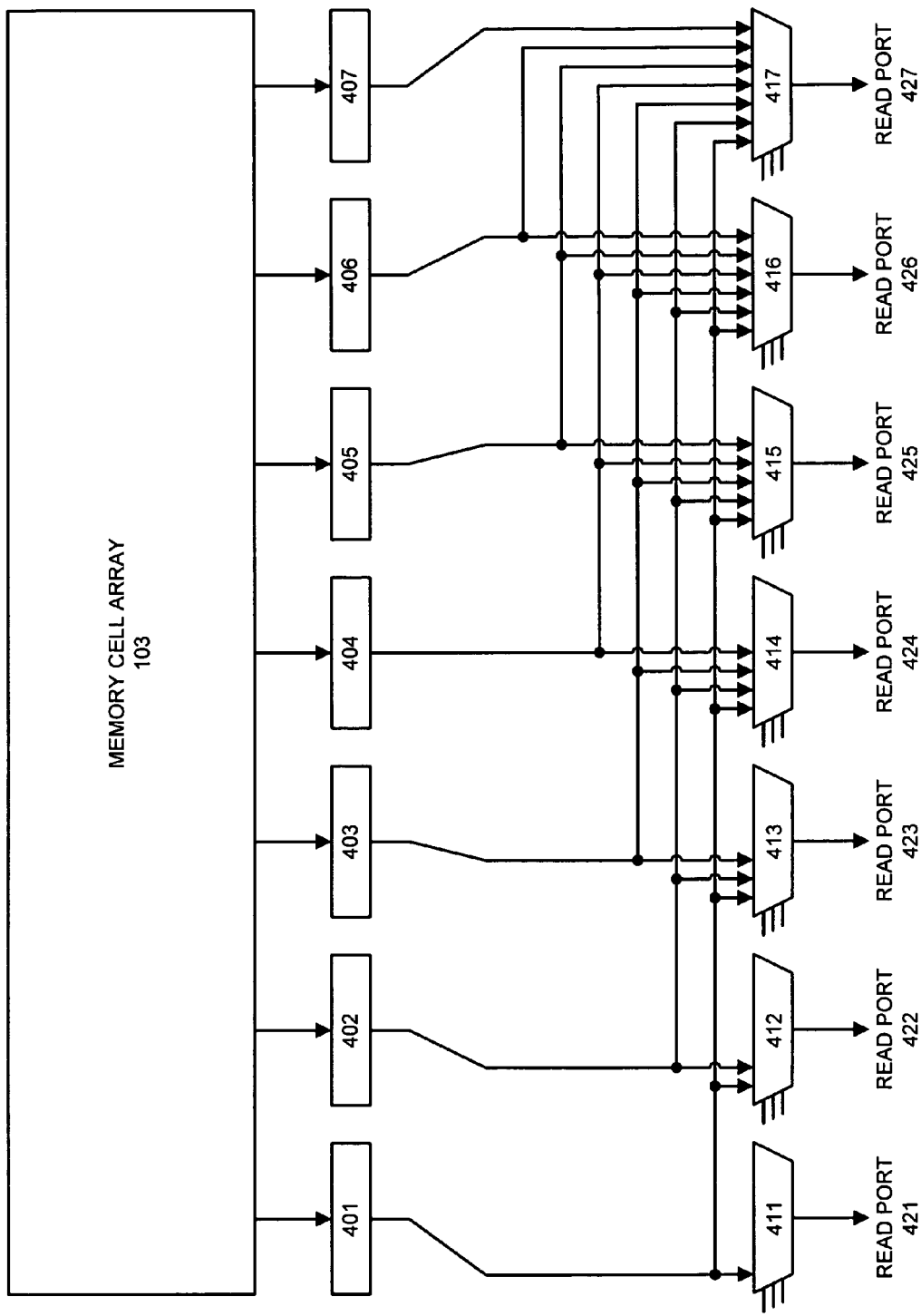
FIG. 4 illustrates circuitry for routing outputs from read bitlines to read ports in accordance with an embodiment of the present invention.

FIG. 4 illustrates circuitry for routing outputs from read bitlines to read ports in accordance with an embodiment of the present invention. After data is read out of memory cell array 103, the data is latched into a number of latches 401-407. These latches include drivers which drive the latched data to a number of multiplexers (MUXs) 411-417, which are associated with read ports 421-427, respectively. These MUXs 411-417 receive select signals which select values to be received by read ports 421-427, respectively. (Note that MUX 411 is only connected to read port 421, so it can be eliminated.)

By using drivers which are external to memory cell array 103 to fan out signals to multiple registers, the drivers within individual memory cells can be smaller, because they only have to drive a single bitline. In this way, a large external driver for each bitline (instead of a driver within each memory cell) can fanout the bitline signal to multiple read ports.

Also note that only a subset of the possible connections between registers 401-407 and read ports 421-427 are required. For example, as illustrated in FIG. 4, register 401 connects to all seven read ports 421-427, while register 402 only connects to six read ports 422-427, and register 403 only connects to five read ports 423-427, and so on, until register 407 only connects to a single read port 427.

Pipelines

Figure 5:
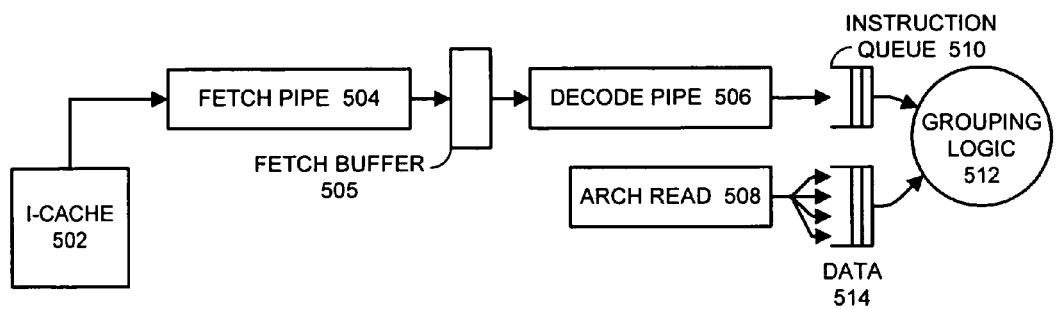
FIG. 5 illustrates the fetch and decode pipes within a processor in accordance with an embodiment of the present invention.

FIG. 5 illustrates the fetch and decode pipes within processor 100 in accordance with an embodiment of the present invention. During instruction execution, instructions are retrieved from instruction cache 502 into fetch pipe 504. After passing through fetch pipe 504, instructions are stored in fetch buffer 505. Instructions from fetch buffer 505 feed into decode pipe 506, which decodes instructions. While an instruction is being decoded, operands for the instruction are speculatively read from the architectural register file (see box 508).

Note that some instructions may not require operands to be read, so for these instructions the speculative read will return garbage. However, by performing the register reads early (during the decoding process), the issue logic for the processor can be simplified.

Because the register read is performed early, it is possible for an outdated value to be retrieved during the register read if the register is updated after the early register read (but before the time the register should have been read). However, this is not a problem because the bypass network associated with the execution pipeline will forward the updated value for the register, so the outdated value will not be used.

After the instruction is decoded in decode pipe 506 (and the register file 102 is read), the decoded instruction is placed in instruction queue 510 and corresponding data from the register file 102 is placed in a corresponding data queue 514. These queues feed into grouping logic 512 which routes the instructions and associated data to appropriate functional units.

Pipelined Execution

Figure 6:
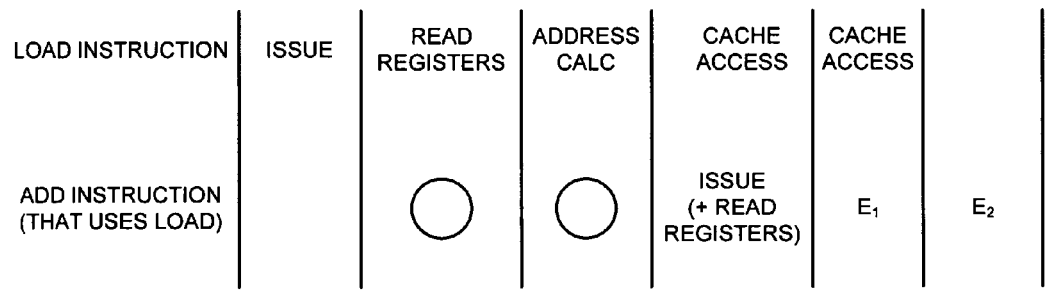
FIG. 6 presents a diagram illustrating pipelined execution of a load instruction and a subsequent use of the load value in accordance with an embodiment of the present invention.

FIG. 6 presents a diagram illustrating pipelined execution of a load instruction and a subsequent use of the load value in accordance with an embodiment of the present invention. Executing load instruction involves a number of pipelined operations. First, the load instruction is issued. Second, registers containing addressing information for the load instruction are read. Third, address calculations are performed using this addressing information. Next, two cycles are required to perform a cache access.

A following dependent ADD instruction, which uses the result returned by the load can be issued during the first cache access cycle for the load instruction. At the same time, registers for the ADD instruction can be speculatively read. (Note that the bypassing network can forward the load value to this ADD instruction.) Next, the ADD instruction uses an ALU to perform the ADD operation in the following two execution steps $E_1$ and $E_2$.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A processor with a register file that supports multiple-issue execution, comprising:
   the processor configured to issue multiple instructions simultaneously;
   the register file within the processor, wherein the register file contains an array of memory cells, which contain bits for architectural registers of the processor;
   wherein the register file includes multiple read ports and multiple write ports to support multiple-issue execution;
   wherein if multiple read ports simultaneously read from a given register, for each memory cell in the given register, the register file is configured to,
      drive a bit stored in a storage element of the memory cell from the storage element to a corresponding set of pass transistors using a driver coupled between the storage element and the set of pass transistors;
      selectively forward the bit from the driver through a pass transistor in the set of pass transistors to a single read bitline in a corresponding set of read bitlines;
      capture the bit from the read bitline using a latch;
      forward the captured bit from the latch to one or more multiplexers that selectively drive the bit to a corresponding read port;
   whereby each memory cell only has to drive the single read bitline (instead of multiple read bitlines) during a multiple-port read operation, thereby allowing memory cells to use smaller and more power-efficient drivers for read operations.

2. The processor of claim 1,
   wherein wordlines associated with specific read ports of the register file are encoded to reduce a number of wordlines;
   wherein using fewer wordlines reduces a length of the read bitlines that span the wordlines; and
   wherein using shorter read bitlines reduces the size of the drivers required to drive the read bitlines.

3. The processor of claim 1, wherein if the register file provides N read ports, N read wordlines for a given register are encoded using:
   a single read wordline to carry a read wordline signal to memory cells of the given register; and
   $\log_2 N$ selection signals, wherein for each bit in the given register, the $\log_2 N$ selection signals are used select a single read bitline from N possible read bitlines to carry the bit out of the array of memory cells, wherein if the bit is directed to multiple read ports, circuitry outside of the array of memory cells is used to direct the bit to the multiple read ports.

4. The processor of claim 1, wherein an execution pipeline of the processor is configured to speculatively read architectural registers for an instruction while the instruction is being decoded, thereby eliminating a need for an out-of-order processor to provide an additional pipeline stage to read the architectural registers.

5. The processor of claim 4, wherein a bypass network associated with the execution pipeline is configured to forward an updated version of an operand from an architectural register if the operand is updated after the operand is speculatively read for an instruction (but before the instruction is executed).

6. The processor of claim 1, wherein after a bit of the given register is read out from the single read bitline, the bit is stored in a latch located outside of the array of memory cells before being driven to one or more read ports.

7. The processor of claim 1, wherein read bitline drivers within the memory cells are only large enough to drive a single read bitline, and are not large enough to drive multiple read bitlines.

8. A computer system with a register file that supports multiple-issue execution, comprising:
   a processor configured to issue multiple instructions simultaneously;
   a memory configured to store code and data for the processor;
   the register file within the processor, wherein the register file contains an array of memory cells, which contain bits for architectural registers of the processor;
   wherein the register file includes multiple read ports and multiple write ports to support multiple-issue execution;
   wherein if multiple read ports simultaneously read from a given register, for each memory cell in the given register, the register file is configured to, drive a bit stored in a storage element of the memory cell from the storage element to a corresponding set of pass transistors using a driver coupled between the storage element and the set of pass transistors;

selectively forward the bit from the driver through a pass transistor in the set of pass transistors to a single read bitline in a corresponding set of read bitlines;

capture the bit from the read bitline using a latch;

forward the captured bit from the latch to one or more multiplexers that selectively drive the bit to a corresponding read port;

whereby each memory cell only has to drive the single read bitline (instead of multiple read bitlines) during a multiple-port read operation, thereby allowing memory cells to use smaller and more power-efficient drivers for read operations.

9. The computer system of claim 8, wherein wordlines associated with specific read ports of the register file are encoded to reduce a number of wordlines;

wherein using fewer wordlines reduces a length of the read bitlines that span the wordlines; and wherein using shorter read bitlines reduces the size of the drivers required to drive the read bitlines.

10. The computer system of claim 8, wherein if the register file provides N read ports, N read wordlines for a given register are encoded using:

a single read wordline to carry a read wordline signal to memory cells of the given register; and $\log_2 N$ selection signals, wherein for each bit in the given register, the $\log_2 N$ selection signals are used select a single read bitline from N possible read bitlines to carry the bit out of the array of memory cells, wherein if the bit is directed to multiple read ports, circuitry outside of the array of memory cells is used to direct the bit to the multiple read ports.

11. The computer system of claim 8, wherein an execution pipeline of the processor is configured to speculatively read architectural registers for an instruction while the instruction is being decoded, thereby eliminating a need for an out-of-order processor to provide an additional pipeline stage to read the architectural registers.

12. The computer system of claim 11, wherein a bypass network associated with the execution pipeline is configured to forward an updated version of an operand from an architectural register if the operand is updated after the operand is speculatively read for an instruction (but before the instruction is executed).

13. The computer system of claim 8, wherein after a bit of the given register is read out from the single read bitline, the bit is stored in a latch located outside of the array of memory cells before being driven to one or more read ports.

14. The computer system of claim 8, wherein read bitline drivers within the memory cells are only large enough to drive a single read bitline, and are not large enough to drive multiple read bitlines.

15. A register file that supports multiple-issue execution, comprising:

an array of memory cells, which contain bits for architectural registers of a processor which contains the register file;

multiple read ports to allow multiple simultaneous reads from the register file;

multiple write ports to allow multiple simultaneous write from the register file;

wherein if multiple read ports simultaneously read from a given register, for each memory cell in the given register, the register file is configured to, drive a bit stored in a storage element of the memory cell from the storage element to a corresponding set of pass transistors using a driver coupled between the storage element and the set of pass transistors;

selectively forward the bit from the driver through a pass transistor in the set of pass transistors to a single read bitline in a corresponding set of read bitlines;

capture the bit from the read bitline using a latch;

forward the captured bit from the latch to one or more multiplexers that selectively drive the bit to a corresponding read port;

whereby each memory cell only has to drive the single read bitline (instead of multiple read bitlines) during a multiple-port read operation, thereby allowing memory cells to use smaller and more power-efficient drivers for read operations.

16. The register file of claim 15, wherein wordlines associated with specific read ports of the register file are encoded to reduce a number of wordlines;

wherein using fewer wordlines reduces a length of the read bitlines that span the wordlines; and wherein using shorter read bitlines reduces the size of the drivers required to drive the read bitlines.

17. The register file of claim 15, wherein if the register file provides N read ports, N read wordlines for a given register are encoded using:

a single read wordline to carry a read wordline signal to memory cells of the given register; and $\log_2 N$ selection signals, wherein for each bit in the given register, the $\log_2 N$ selection signals are used select a single read bitline from N possible read bitlines to carry the bit out of the array of memory cells, wherein if the bit is directed to multiple read ports, circuitry outside of the array of memory cells is used to direct the bit to the multiple read ports.

18. The register file of claim 15, wherein an execution pipeline of the processor containing the register file is configured to speculatively read architectural registers for an instruction while the instruction is being decoded, thereby eliminating a need for an out-of-order processor to provide an additional pipeline stage to read the architectural registers.

19. The register file of claim 18, wherein a bypass network associated with the execution pipeline is configured to forward an updated version of an operand from an architectural register if the operand is updated after the operand is speculatively read for an instruction (but before the instruction is executed).

20. The register file of claim 15, wherein after a bit of the given register is read out from the single read bitline, the bit is stored in a latch located outside of the array of memory cells before being driven to one or more read ports.

21. The register file of claim 15, wherein read bitline drivers within the memory cells are only large enough to drive a single read bitline, and are not large enough to drive multiple read bitlines.

* * * * *